United States Patent [19]
Laskaris et al.

[11] Patent Number: 5,179,338
[45] Date of Patent: Jan. 12, 1993

[54] REFRIGERATED SUPERCONDUCTING MR MAGNET WITH INTEGRATED GRADIENT COILS

[75] Inventors: Evangelos T. Laskaris; Peter B. Roemer, both of Schenectady; Bizhan Dorri, Clifton Park; Mark E. Vermilyea, Schenectady, all of N.Y.

[73] Assignee: General Electric Company, Schenectady, N.Y.

[21] Appl. No.: 759,337

[22] Filed: Sep. 13, 1991

[51] Int. Cl.⁵ ............................................. G01V 3/00
[52] U.S. Cl. ...................................... 324/318; 335/300
[58] Field of Search ........................ 324/318, 319, 320; 335/299, 216, 301, 300

[56] References Cited

U.S. PATENT DOCUMENTS

| | | | |
|---|---|---|---|
| 4,646,024 | 2/1987 | Schenck et al. | 324/318 |
| 4,652,824 | 3/1987 | Oppelt | 324/318 |
| 4,737,716 | 4/1988 | Roemer et al. | 324/319 |
| 4,837,541 | 6/1989 | Pelc | 335/301 |
| 4,924,198 | 5/1990 | Laskaris | 335/216 |
| 4,983,942 | 1/1991 | Benesch | 324/318 |

*Primary Examiner*—Louis Arana
*Attorney, Agent, or Firm*—James R. McDaniel

[57] ABSTRACT

The invention relates to refrigerated superconducting MR magnets having integrated gradient coils. In particular, the amount of eddy currents produced by the magnet are substantially reduced while reducing the size and weight, and, therefore, the cost of the superconducting magnet required to produce an MR image.

14 Claims, 3 Drawing Sheets

REFRIGERATED SUPERCONDUCTING MR MAGNET WITH INTEGRATED GRADIENT COILS

CROSS REFERENCE TO RELATED APPLICATIONS

This application is related to commonly assigned U.S. patent applications Ser. Nos. 07/759387 and 07/759389, entitled "Refrigerated Superconducting MR Magnet with Integrated Cryogenic Gradient Coils" and "Eddy Current Free MRI Magnet With Integrated Gradient Coils", respectively.

BACKGROUND OF THE INVENTION

1. Field of the Invention

This invention relates to refrigerated superconducting MR magnets having integrated gradient coils. Such structures of this type generally reduce the size and weight and therefore, the cost of the superconducting magnet required for an MR imaging system while substantially eliminating the eddy currents in the magnet.

2. Description of the Related Art

Present superconducting MR magnets employ windings which operate in liquid helium to maintain the temperature at approximately 4K. The liquid helium pool requires a vessel which is vacuum tight and which meets ASME pressure vessel requirements; such a vessel is typically made of welded aluminum alloy cylinders and flanges. Thermal radiation shields, of which two are typically used, are also made of welded aluminum pieces and contain the helium vessel. When the gradient coils in the bore of the magnet are electrically pulsed, the resulting time changing magnetic flux in any of the electrically conducting cylinders sets up eddy currents which, in turn, produce other magnetic fields which degrade the quality of the desired gradient field in space and time. This behavior makes it attractive for the aggressive pulse sequences which are routinely used in MR imaging today to use a second set of gradient coils in the magnet bore. This shield gradient coil sets up fields which counteract those of the main gradient coil outside of the shield coil, thus greatly reducing any mutual inductance with conducting members such as the thermal shields and minimizing the resultant eddy currents.

The use of such shield gradient coils increases the radial thickness of the gradient coil set relative to a simple single coil set because of the required gap between them and dictates the size, and thus weight and cost, of the magnet, which must lie radially outside of the shield gradient. Therefore, a more advantageous system, then, would be realized if the magnet could be made to have no mutual coupling to the gradient coil set and could be placed in much closer proximity to the gradients without having any deleterious eddy currents induced in it. The resulting system could be dramatically smaller and less expensive than existing ones.

It is apparent from the above that there exists a need in the art for a refrigerated superconducting MR magnet which is reduced in size, weight and cost through simplicity of parts and uniqueness of structure, and which at least equals the imaging characteristics of known superconducting magnets, but which at the same time substantially reduces the amounts of resultant eddy currents produced in the magnet by the gradient coils. It is a purpose of this invention to fulfill this and other needs in the art in a manner more apparent to the skilled artisan once given the following disclosure.

SUMMARY OF THE INVENTION

Generally speaking, this invention fulfills these needs by providing a refrigerated superconducting MR magnet for reducing resultant eddy currents resulting from a gradient coil pulsation, comprising at least two gradient coil means substantially located at a predetermined distance away from each other, a shield means substantially located between said gradient coil means, a magnet cartridge means having a coil form means and a coil means wound on said coil form means and substantially located within said shield means, a support means, a RF shield means rigidly attached to one of said gradient coil means, a vacuum enclosure means rigidly attached to said gradient coil means and said support means and enclosing said gradient coil means, said shield means, said cartridge means and said support means, a RF coil means located at a predetermined distance away from said RF shield means, and a passive shim means substantially located between said RF shield means and said RF coil means.

In certain preferred embodiments, the gradient coil means operate at room temperature (300K). Also, the vacuum enclosure means includes an outer vacuum vessel which is rigidly attached to one of the gradient coil means. This gradient coil means provides shielding for the main gradient coil means, thereby reducing eddy currents in the outer vacuum vessel. Finally, in order to further reduce eddy currents induced from the electrical pulsation of the gradient means, the shield means are electrically segmented in the circumferential direction by virtue of using overlapping axially oriented copper straps which are bonded to the shield means with the straps being electrically insulated from one another by a film insulation such as Mylar polycarbonate film to provide good axial and circumferential thermal conduction. The insulation being applied either directly to each strap or inserted at the overlapping interface between each strap.

In another further preferred embodiment, the size and weight and, ultimately, the cost of the MR imaging system is reduced when the superconducting magnet of the present invention is employed while substantially eliminating the eddy currents produced in the magnet by the gradient coil operation.

The preferred superconducting MR magnet, according to this invention, offers the following features: lightness in weight; good superconducting characteristics; good MR imaging characteristics; good stability; reduced resultant eddy currents; good durability; improved economy; and high strength for safety. In fact, in many of the preferred embodiments, these factors of weight, eddy currents and economy are optimized to an extent considerably higher than heretofore achieved in prior, known superconducting MR magnets.

BRIEF DESCRIPTION OF THE DRAWINGS

The above and other features of the present invention which will become more apparent as the description proceeds are best understood by considering the following detailed description in conjunction with the accompanying drawings wherein like characters represent like parts throughout the several views and in which.

DETAILED DESCRIPTION OF THE INVENTION

Figure 1:
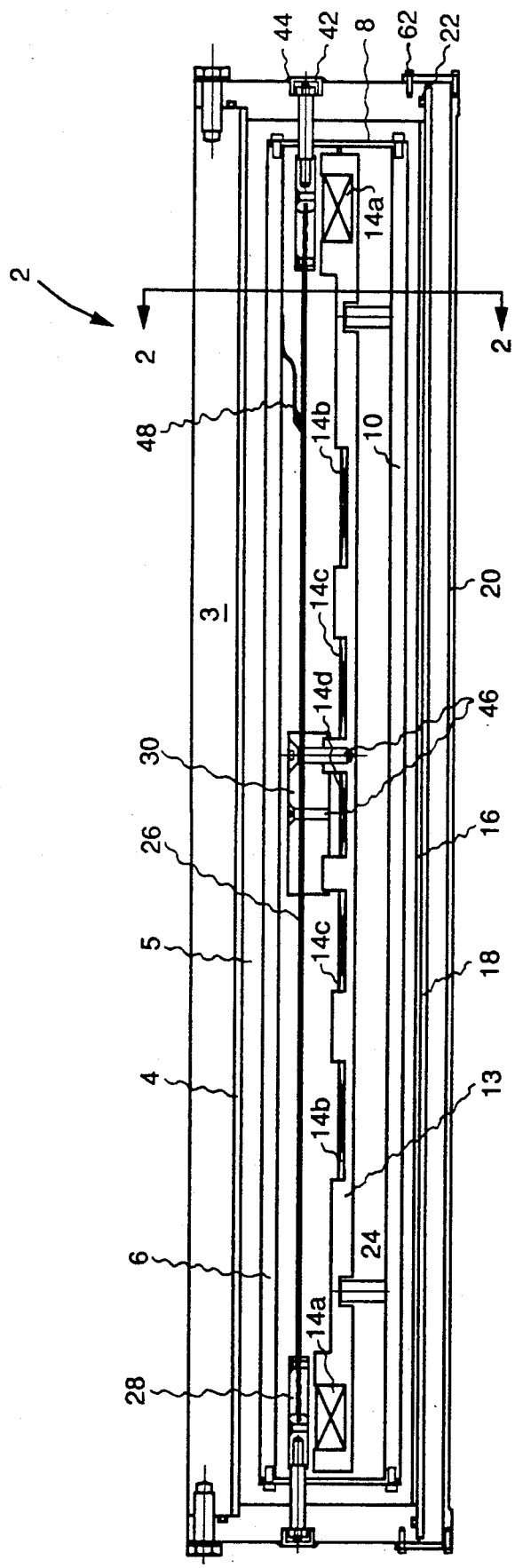
FIG. 1 is a side plan view of a refrigerated superconducting MR magnet with integrated gradient coils according to the present invention.

With reference first to FIG. 1, there is illustrated a refrigerated superconducting, integrated gradient coil MR magnet 2. Included as part of magnet 2 is outer vacuum vessel 3. Vessel 3, preferably, is constructed of any suitable ferromagnetic and impermeable material such as iron or carbon steel. Rigidly attached by conventional bonding techniques to the inside of vessel 3 is shield gradient coil 4. Coil 4, preferably, is constructed the same as the gradient coils set forth in U.S. Pat. No. 4,737,716, to Roemer et al. entitled "Self-Shielded Gradient Coils for Nuclear Magnetic Resonance Imaging", and assigned to the same assignee as the present invention.

Located away from coil 4 are outer thermal radiation shield 6, end plates 8 and inner thermal radiation shield 10. Shields 6, 10 and end plates 8, preferably, are constructed as a composite of a moderate strength, nonconductive material such as any suitable fiber-reinforced epoxy material and a highly conductive material such as copper or aluminum. Shields 6, 10 and end plates 8 are rigidly attached to one another by conventional fasteners 54 (FIG. 3) to form shield assembly 11. In order to eliminate eddy currents induced from the pulsation of gradient coils 4 and 16, the conductive parts of shields 6 and 10 and end plates 8 are electrically segmented in the circumferential direction. In particular, overlapping axial straps 33 (FIG. 2) which are constructed of any material with high thermal conductivity such as copper or aluminum are bonded by conventional bonding techniques to the inner or outer surfaces of shields 6, 10 and end plates 8 and are electrically insulated from one another by insulators 32, preferably, Mylar film. These straps 33 provide good axial and circumferential thermal conduction. Insulators 32 are either applied directly to each strap 33 or are inserted at the overlapping interface between each strap 33.

Figure 3:
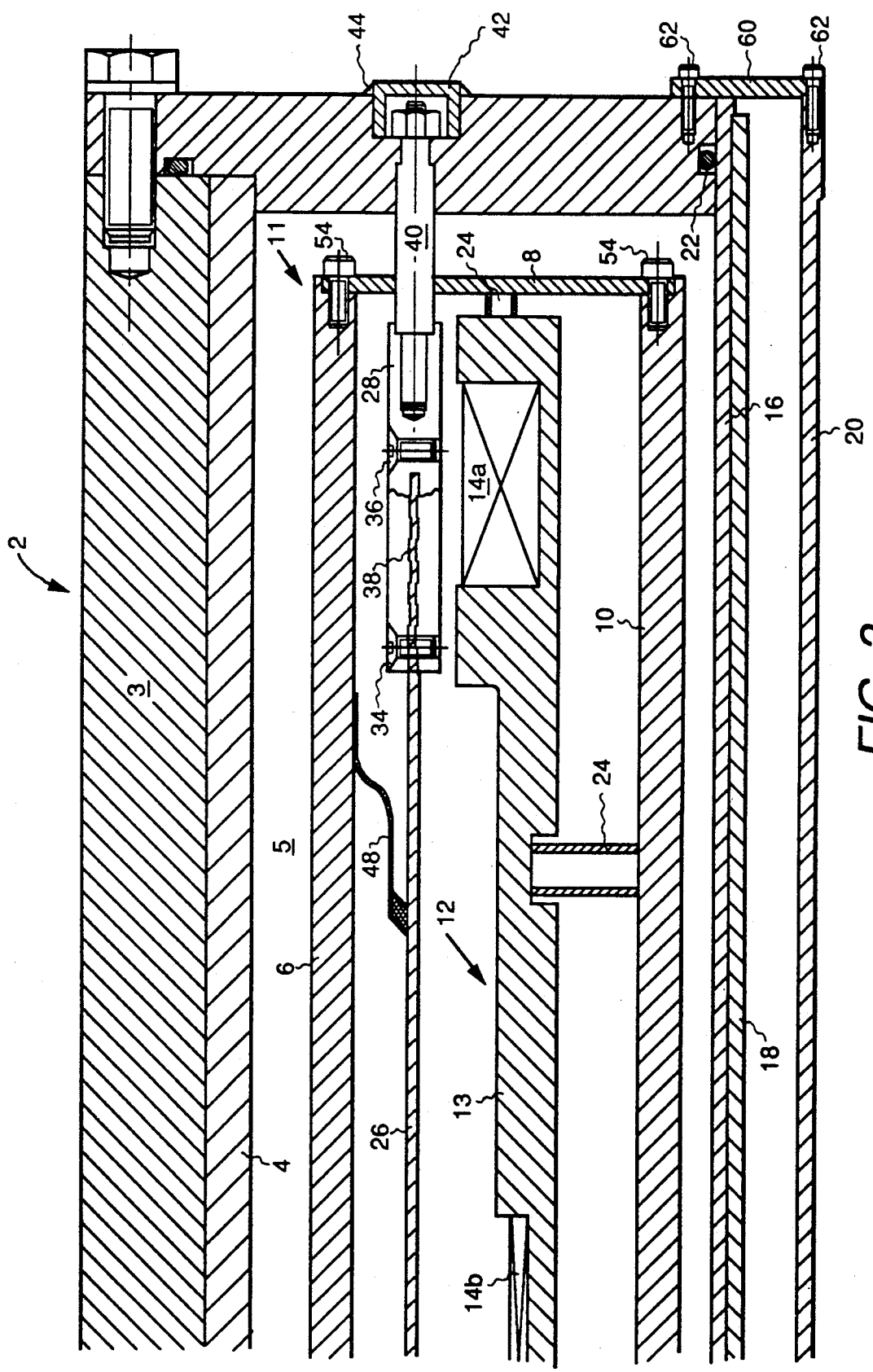
FIG. 3 is a detailed, side plan view illustrating the connections between the gradient coils, the enclosure, the thermal shield, the magnet cartridge, the support means, and the RF coil, according to the present invention.

A magnet cartridge 12 is supported within shield assembly 11 (FIG. 3). Cartridge 12 includes coils 14a-14d. Cartridge 12 could have 4 or more coils which produce a field in some portion of the magnet bore which is sufficiently uniform to produce MR images. Coils 14a-14d, preferably, are constructed of $Nb_3Sn$ which is wound on coil from 13. Cartridge 12 is substantially constructed the same as winding 13 as set forth in U.S. Pat. No. 4,924,198, to E. T. Laskaris, entitled "Superconductive Magnetic Resonance Magnet Without Cryogens" and assigned to the same assignee as the present invention. Cartridge 12 is supported within magnet 2 by straps 26 and mechanical connectors 28, 30. Straps 26 which, preferably, are constructed of any suitable fiberglass material are rigidly held within to clamp 28 which, in turn, is held together with conventional fasteners 34 and 36 (FIG. 3). Clamp 28, preferably, is constructed of stainless steel and contains grooves 38 which mate with matching grooves in strap 26 so that strap 26 remains stationary within clamp 28.

The grooves in strap 26 and clamp 28 are constructed by conventional machining techniques. Clamp 28 is rigidly attached to vessel 3 by a conventional close tolerance fastener 40. A cap 42 is placed over vessel 3 at the place where fastener 40 connects with vessel 3 and a vacuum tight weldment 44 is placed around cap 42 to provide a vacuum seal between cap 42 and vessel 3. Cap 42 and weldment 44 are used to eliminate any leakage from the atmosphere to cavity 5 along fastener 40.

Cartridge 12 is rigidly attached to strap 26 by mechanical supports 30 and a conventional fasteners 46. Mechanical support 30, preferably, is constructed of nonmagnetic stainless steel, hereinafter referred to as NMSS. Straps 26, preferably, are located at approximately 90° from each other around the circumference of cartridge 12. A minimum of four axial straps 26 is required to provide support of cartridge 12 against vertical as well as horizontal inertia forces. Straps 26, preferably, are pretensioned by clamps 28 during assembly and as a result of cooldown from ambient (300° K.) to cryogenic temperatures (10K to 40K). Cooldown of magnet 2 results in no forces from the suspension because cartridge 12 is suspended from the middle of each strap 26. Straps 26 are also heat stationed to shield 6 by braids 48 to minimize the heat transfer to cartridge 12. Braids 48, preferably, are constructed of copper and are connected to shield 6 and strap 26 by conventional connectors having a high thermal conductivity in a vacuum. Shield assembly 11 is suspended directly from cartridge 12 by axially and by radially-oriented, fiber-reinforced thin wall tubes 24 (FIG. 3). Tubes 24, preferably, are constructed of carbon graphite or equivalent high strength low thermal conductivity fiber reinforced materials.

Figure 2:
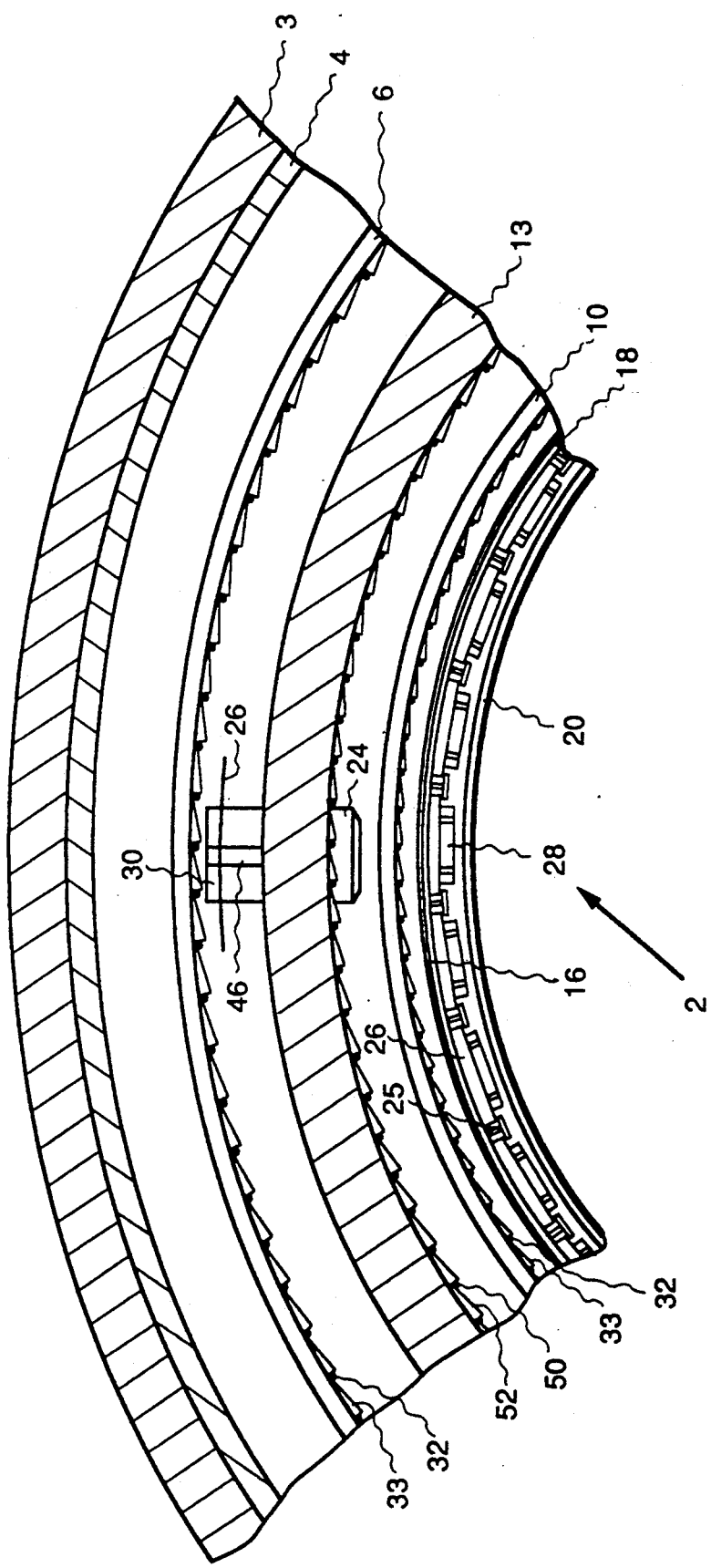
FIG. 2 is an end view of a refrigerated superconducting MR magnet with integrated gradient coils, taken along line 2—2 in FIG. 1, according to the present invention.

In order to eliminate eddy currents induced from the pulsation of gradient coils 4 and 16, while maintaining high axial thermal conduction which is required to have a uniform temperature along magnet cartridge 12, cartridge 12 is electrically segmented in the circumferential direction (FIG. 2). In particular, overlapping axial straps 52 of copper are bonded by conventional bonding on the inner surface of cartridge 12 and are electrically insulated from one another by insulators 50, preferably, a film insulation such as Mylar film to provide good axial thermal conduction. Insulators 50 are either applied directly to each strap 52 or are inserted at the overlapping interface between each strap 52.

Main gradient coil 16 holds RF shield 18 which is made by conventional methods using eddy current free, segmented copper construction. Main gradient coil 16, preferably, is constructed in the same manner as shield gradient coil 4. Coil 16, preferably, operates at room temperature (300K). Coil 16 along with elastometric o-ring seal 22 is used to form a vacuum tight fiberglass composite shell that is used as the bore vacuum envelope of the magnet cryostat.

Radially inward of coil 16 and RF shield 18 is a space for a passive shim set which includes axial rails 25, drawers 26 and conventional passive shims 28 (FIG. 2). In particular, rails 25 are bonded by conventional bonding techniques to the inner radial surface of RF shield 18 to provide support for drawers 26. Drawers 26 are preferably constructed of fiberglass and are used to carry passive shims 28. Conventional RF coil 20 is located radially inward of the passive shim assembly and is attached to the magnet 2 by extension 60 and conventional fasteners 62. Extension 60, preferably, is constructed of stainless steel.

During operation, thermal shield assembly 11 and magnet cartridge 12 are thermally connected by conventional connectors to the first and second stages of a conventional Gifford-McMahon cryocooler respectively. In this manner, the thermal shield assembly 11 is substantially maintained at approximately 40K temperature while magnet cartridge 12 is maintained at approximately 10K temperature.

There are several advantages of the present invention over prior superconducting MR magnets. First, because gradient coils 4 and 16 are located within vessel 3, the size of vessel 3 is substantially reduced which reduces the weight and the cost of magnet 2. Second, due to the fact that gradient coils 4 and 16 and thermal shields 6 and 10 have been relocated, this means that only a small volume will be magnetized by magnet 2 which reduces the amount of superconductor material needed for coils 14a–14d which again reduces the weight and cost of magnet 2. Third, because magnet 2 is operated in a vacuum, the acoustic noise created by gradient coils 4 and 16 is not conducted outside of vessel 3 which reduces the patient's discomfort associated with acoustic noise. Finally, the patient's claustrophobic fear associated with being in an enclosed environment is reduced by virtue of the shorter length of the magnet.

Once given the above disclosure, many other features, modifications or improvements will become apparent to the skilled artisan. Such features, modifications or improvements are, therefore, considered to be a part of this invention, the scope of which is to be determined to by the following claims.

What is claimed is:

1. A refrigerated superconducting magnet for reducing eddy currents resulting from a gradient coil pulsation, said magnet is comprised of:
   at least two gradient coil means substantially located at a predetermined distance away from each other;
   a shield means substantially located between said gradient coil means;
   a magnet cartridge means having a coil form means and a coil means wound on said coil form means and substantially located within said shield means;
   a first and second support means substantially located between said magnet cartridge means and said shield means;
   a RF shield means rigidly attached to one of said gradient coil means;
   a vacuum enclosure means rigidly attached to said gradient coil means and enclosing said gradient coil means, said shield means, said cartridge means, and said support means;
   a RF coil means substantially located at a predetermined distance away from said RF shield means; and
   a passive shim means substantially located between said RF shield means and said RF coil means.

2. The magnet, according to claim 1, wherein said gradient coil means is further comprised of:
   a shield gradient coil; and
   a main gradient coil.

3. The magnet, according to claim 1, wherein said shield means is further comprised of:
   inner and outer thermal radiation shield means; and
   an end plate means rigidly attached to said inner and outer thermal radiation shield means to form a thermal shield assembly.

4. The magnet, according to claim 3, wherein said shield means is further comprised of:
   a first axial strap means rigidly attached to said inner and outer thermal radiation shield means and said end plate means; and
   an insulation means substantially located on said first axial strap means.

5. The magnet, according to claim 4, wherein said magnet cartridge means is further comprised of:
   a second axial strap means which substantially eliminates any eddy currents which contact said magnet cartridge means and is rigidly attached to said magnet cartridge means; and,
   an insulation means substantially located on said second axial strap means.

6. The magnet, according to claim 5, wherein said strap means are substantially located 90° from each other around said magnet cartridge means.

7. The magnet, according to claim 1, wherein said first support means is further comprised of:
   a strap means; and
   first and second connector means rigidly attached to said strap means, wherein said second connection means is rigidly attached to said vacuum enclosure means.

8. The magnet, according to claim 7, wherein said strap means are further comprised of:
   a groove means.

9. The magnet, according to claim 7, wherein said second connector means are further comprised of:
   a groove means; and
   a fastener means.

10. The magnet, according to claim 7, wherein said magnet cartridge means is rigidly attached by said first connector means to said strap means.

11. The magnet, according to claim 1, wherein said second support means is further comprised of:
    at least one thin wall tube means.

12. The magnet, according to claim 11, wherein said tube means is substantially located between said magnet cartridge means and said shield means.

13. The magnet, according to claim 1, wherein said passive shim means is further comprised of:
    an axial rail means rigidly attached to said RF shield means;
    a drawer means which engages said axial rail means; and
    a shim means rigidly attached to said drawer means.

14. The magnet, according to claim 1, wherein said gradient coil means operate at a temperature of about 300K.

* * * * *